United States Patent
Krutsick

(10) Patent No.: US 8,269,265 B2
(45) Date of Patent: Sep. 18, 2012

(54) TRENCH CAPACITOR FOR HIGH VOLTAGE PROCESSES AND METHOD OF MANUFACTURING THE SAME

(75) Inventor: Thomas J. Krutsick, Fleetwood, PA (US)

(73) Assignee: Microsemi Semiconductor (U.S.) Inc., Austin, TX (US)

( * ) Notice: Subject to any disclaimer, the term of this patent is extended or adjusted under 35 U.S.C. 154(b) by 644 days.

(21) Appl. No.: 12/172,532

(22) Filed: Jul. 14, 2008

(65) Prior Publication Data

US 2010/0006979 A1    Jan. 14, 2010

(51) Int. Cl.
*H01L 27/108* (2006.01)
*H01L 21/20* (2006.01)

(52) U.S. Cl. ............ 257/301; 257/E29.346; 438/386

(58) Field of Classification Search .......... 257/532, 257/301, E27.092, E27.095, E29.345, E29.346, 257/E21.008, E29.343, E29.324
See application file for complete search history.

(56) References Cited

U.S. PATENT DOCUMENTS

| | | | |
|---|---|---|---|
| 5,959,322 A * | 9/1999 | Lee | 257/298 |
| 6,396,090 B1 * | 5/2002 | Hsu et al. | 257/242 |
| 6,713,813 B2 * | 3/2004 | Marchant | 257/330 |
| 2002/0113288 A1 * | 8/2002 | Clevenger et al. | 257/513 |
| 2008/0012610 A1 * | 1/2008 | Aoki et al. | 327/109 |

* cited by examiner

*Primary Examiner* — Victor A Mandala
*Assistant Examiner* — Selim Ahmed
(74) *Attorney, Agent, or Firm* — Williams, Morgan & Amerson, P.C.

(57) ABSTRACT

The present invention provides embodiments of a capacitor and a method of forming the capacitor. The capacitor includes one or more trenches formed in a semiconductor layer above a substrate. The trench includes dielectric material deposited on the trench walls and a conductive fill material formed within the trench and above the dielectric material. The capacitor also includes one or more first doped regions formed adjacent the trench(es) in the semiconductor layer. The first doped region is doped with a first type of dopant. The capacitor further includes one or more second doped regions formed adjacent the first doped region(s) in the semiconductor layer. The second doped regions are doped with a second type of dopant that is opposite to the first type of dopant.

19 Claims, 6 Drawing Sheets

TRENCH CAPACITOR FOR HIGH VOLTAGE PROCESSES AND METHOD OF MANUFACTURING THE SAME

BACKGROUND OF THE DISCLOSURE

1. Technical Field

The present disclosure relates generally to semiconductor processing, and, more particularly, to manufacturing a trench capacitor for high voltage processes.

2. Description of the Related Art

A simple capacitor consists of two conducting plates separated by dielectric material. Ions and electrons in the dielectric material migrate to opposite plates and form an electric field within the dielectric material when a voltage is applied across the two conducting plates. The charge separation and the electric field are maintained when the voltage is removed so that the capacitor can store energy equivalent to the work required to form the electric fields by moving the ions and electrons. Capacitors are used in a wide variety of semiconductor devices and a variety of techniques have been developed to form capacitors.

FIGS. 1A, 1B, and 1C conceptually illustrate a conventional technique for forming a capacitor using bipolar technology. An SOI substrate 105 is used as the starting material for forming the capacitor. As depicted in FIG. 1A, the SOI substrate 105 is comprised of a bulk substrate 110, a buried insulation layer 115 and an active layer 120. Typically the bulk substrate 110 is comprised of silicon, the buried insulation layer 115 is comprised of silicon dioxide (a so-called "BOX" layer), and the active layer 120 is comprised of silicon (doped or undoped). Such SOI structures may be readily obtained from a variety of commercially known sources. Typically, the buried insulation layer 115 will be relatively thick, e.g., on the order of approximately 0.5-2 microns, and the active layer 120 may have an initial thickness of approximately 1-5 microns.

The active layer 120 is a layer of epitaxial silicon that is deposited in an epi reactor. The active layer 120 is doped with an N-type dopant material, e.g., phosphorous or arsenic. Note that the distribution of dopant atoms within the active layer 120 may not be uniform throughout its depth. An epitaxial layer 125 of silicon is then grown over the active layer 120. Growing the epitaxial layer 125 (which is also referred to as an N-epi region or a P-epi region for a capacitor formed using the opposite dopants) also causes some of the dopant material to diffuse out of the active layer 120 and form a buried layer 130 (which may also include some or all of the active layer 120). Although FIG. 1A depicts the layers 120, 125, 130 as distinct layers, in practice the boundaries between the layers 120, 125, 130 may be very difficult to define. Nevertheless, the distinct layers are shown for purposes of explanation only. The dopant concentration varies from a relatively high level in the layer 120 to a relatively low level in the layer 125. The dopant concentration in the buried doped layer 130 is typically in the range of approximately $10^{18\text{-}20}$ atoms/cm$^{-3}$ and the dopant concentration in the N-epi region 125 is typically in the range of approximately $10^{14\text{-}16}$ atoms/cm$^{-3}$.

FIG. 1B shows the formation of illustrative sinkers 135. The sinkers 135 are formed by implanting an N-type dopant material and then applying heat to cause the dopant material to diffuse outwards and downwards so that the sinkers 135 overlap with the buried layer 130. The region in which the sinkers 135 overlap (or crossover) with the buried layer 130 is typically referred to as the crossover region 137. The dopant concentration in the crossover region 137 is approximately in the range from $2 \times 10^{15}$ to $5 \times 10^{17}$ ions/cm$^3$. The dopant concentration in other portions of the buried layer 130 and/or the sinkers 135 is typically higher than the dopant concentration in the crossover region. The dopant concentration is typically lower for thicker epi layers 125 because it is harder to diffuse down from the sinker 135 and up from the buried layer 130.

FIG. 1C shows a trench 140 that is formed between the sinkers 135. The trench 140 includes a dielectric portion 145 and a polysilicon fill 150. For example, the buried layer 130 and the N-epi region 125 may be etched to form the trench 140 and then a dielectric (or stack of dielectrics) can be deposited on the walls of the trench 140. The poly fill 150, which may be doped or undoped, is used to fill the remaining opening in the trench 140. The polysilicon fill 150 forms one of the "plates" of the capacitor and the doped regions 130, 135 form the other "plate" of the capacitor. The dielectric portion 145 forms the "dielectric" of the capacitor. Applying voltages to the contacts (C+, C−) of the capacitor causes ions and electrons in the dielectric portion 145 to migrate towards the doped regions 130, 135 and the polysilicon fill 150. Although not shown in FIG. 1C, the capacitor may also include various passivation layers and contacts.

FIG. 2 shows the variation in capacitance of the capacitor depicted in FIG. 1C as a function of the applied voltage. The horizontal axis indicates the applied bias voltage and the vertical axis indicates the normalized capacitance (C_norm). The normalized capacitance is the measured capacitance of the capacitor divided by its ideal capacitance, which in this case is the accumulation region capacitance. The capacitor depicted in FIG. 1C is prone to deep depletion effects during pulsing and/or sweeping of the bias voltage from accumulation to inversion. The inset figure shows an applied bias voltage that begins at +40 V, steps down to −40 V, and then ramps back up to +40 V with increasing time. When this voltage profile is applied to the capacitor shown in FIG. 1C, the normalized capacitance drops to less than 0.92 when the applied bias voltage drops from +40V to −40V. The normalized capacitance then rises with increasing bias voltage until it reaches approximately 1.0 at a bias voltage of approximately +10V. The depletion effects exhibited at large negative biasing voltages are believed to be, at least in part, a consequence of the thickness of the dielectric region 145 and the effect of lateral and/or crossover diffusion of dopants in the doped regions 130, 135.

SUMMARY

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a capacitor and a method of forming the capacitor are provided. The capacitor includes one or more trenches formed in a semiconductor layer above a substrate. The trench includes dielectric material deposited on the trench walls and a conductive fill formed within the trench and above the dielectric material. The capacitor also includes one or more first doped regions formed adjacent the trench (es) in the semiconductor layer. The first doped region is doped with a first type of dopant. The capacitor further includes one or more second doped regions formed adjacent the first doped region(s) in the semiconductor layer. The second doped regions are doped with a second type of dopant that is opposite to the first type of dopant.

BRIEF DESCRIPTION OF THE DRAWINGS

The disclosed subject matter may be understood by reference to the following description taken in conjunction with the accompanying drawings, in which like reference numerals identify like elements, and in which.

Figure 1A:
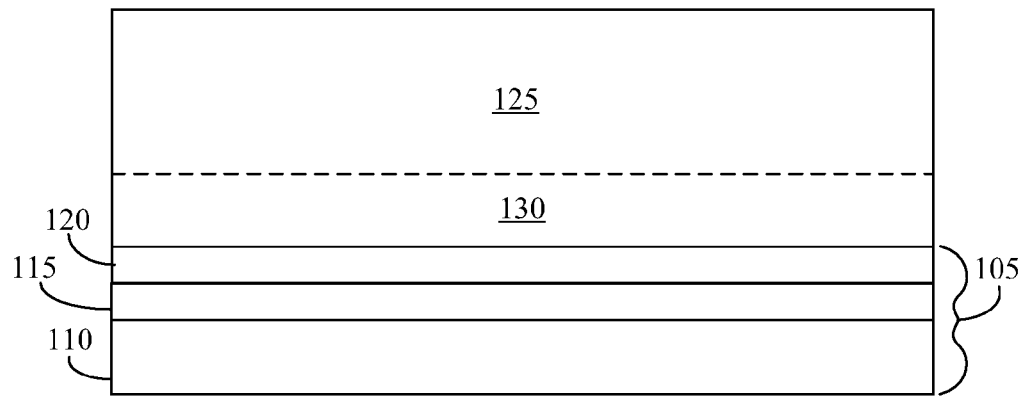
FIGS. 1A, 1B, and 1C conceptually illustrate a conventional technique for forming a capacitor using bipolar technology.
Figure 1B:
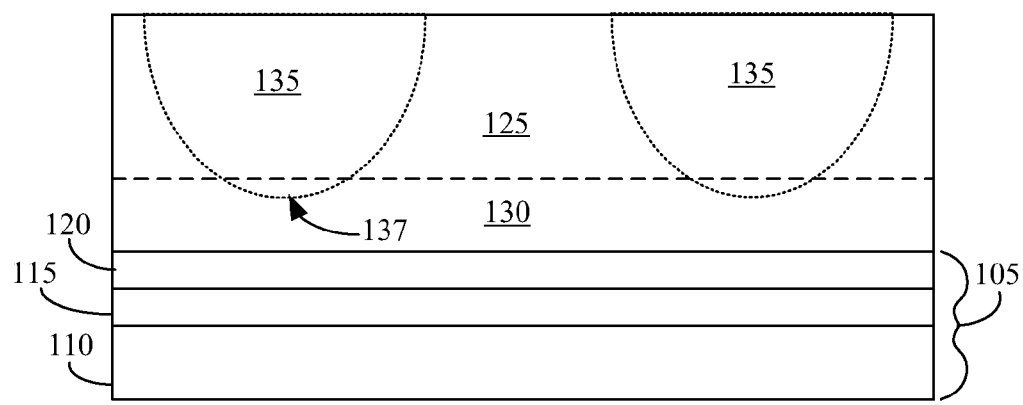

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1C:
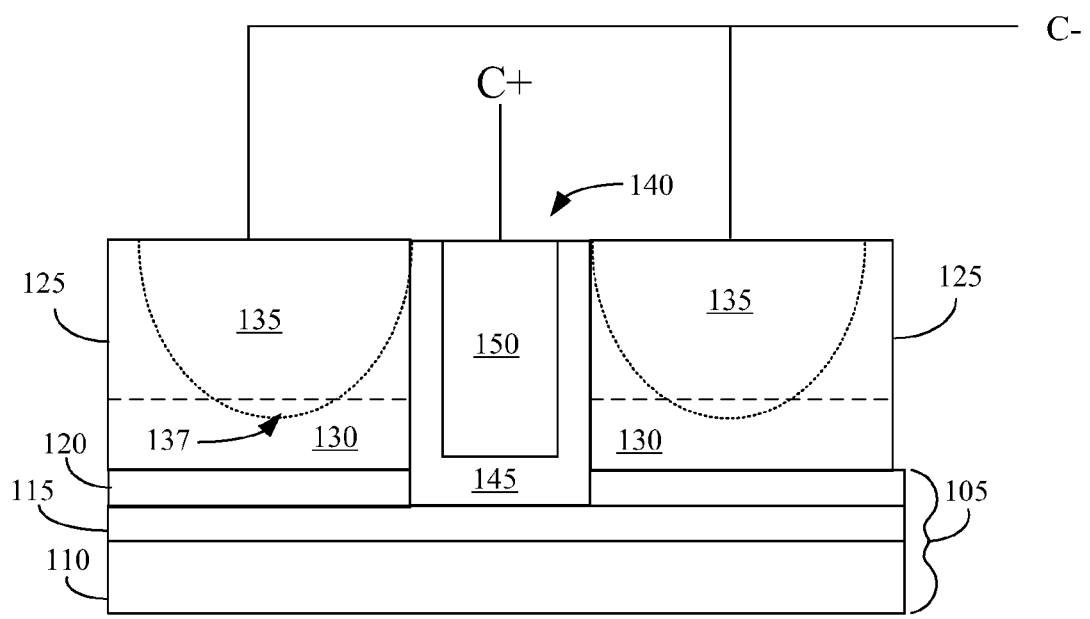
Figure 3:
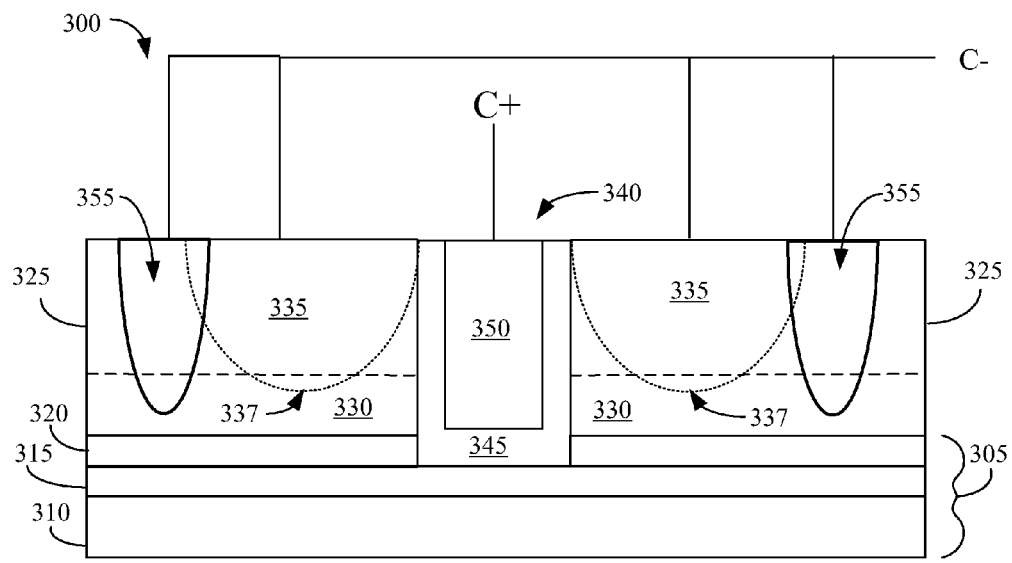
FIG. 3 conceptually illustrates a first exemplary embodiment of a capacitor formed using bipolar technology.

FIG. 3 conceptually illustrates one illustrative embodiment of a capacitor 300 formed using bipolar technology. The illustrative embodiment of the capacitor 300 may include elements that are similar or analogous to elements used to form conventional capacitors, such as the capacitor shown in FIG. 1C. However, persons of ordinary skill in the art having benefit of the present disclosure should appreciate that, in alternative embodiments, the capacitor 300 may be formed using other elements that differ from the elements used to form conventional capacitors. In the illustrated embodiment, an SOI substrate 305 is used as the starting material for the present invention. As depicted in FIG. 3, the SOI substrate 305 is comprised of a bulk substrate 310, a buried insulation layer 315 and an active layer 320. In the illustrated embodiment, the bulk substrate 310 is comprised of silicon, the buried insulation layer 315 is comprised of silicon dioxide (a so-called "BOX" layer), and the active layer 320 is comprised of silicon (doped or undoped). However, in alternative embodiments, the substrate 305 may not necessarily be an SOI substrate and/or the substrate 305 may be formed using different materials. The buried insulation layer 315 shown in FIG. 3 may be relatively thick, e.g., on the order of approximately 0.5-2 microns, and the active layer 320 may have an initial thickness of approximately 2 microns.

The active layer 320 may be a layer of epitaxial silicon that is deposited in an epi reactor and doped with an N-type dopant material, e.g., phosphorous or arsenic. However, persons of ordinary skill in the art having benefit of the present disclosure should appreciate that alternative embodiments may include an active layer 320 that is doped with a P-type material. In these alternative embodiments, dopants used in other portions of the capacitor 300 may also be reversed, e.g., N-type dopants may be replaced with P-type dopants and P-type dopants may be replaced with N-type dopants. The layer of epitaxial silicon 320 may be doped by introducing dopant materials into an epi reactor during the process used to form the layer 320. However, the dopant material may also be introduced into the layer of silicon 320 by performing an ion implant process after the layer of silicon 320 is formed. In either case, the distribution of dopant atoms within the layer of silicon 320 may not be uniform throughout its depth.

The capacitor 300 also includes an epitaxial layer 325 formed over the active layer 320 and a buried doped layer 330 that is formed intermediate the epitaxial layer 325 and the active layer 320. In one embodiment, the epitaxial layer 325 may be comprised of silicon and it may be grown over the active layer 320. Growing the epitaxial layer 325 (which is also referred to as an N-epi region when an N-type dopant is used) may also cause some of the dopant material to diffuse out of the active layer 320 and form a buried layer 330, which may also include some or all of active layer 320. Although FIG. 3 depicts the layers 320, 325, 330 as distinct layers, in practice the boundaries between the layers 320, 325, 330 may not be as sharp as depicted in FIG. 3. Nevertheless, the distinct layers are shown for purposes of explanation. In one embodiment, the dopant concentration varies from a relatively high level in the layer 320 to a relatively low level in the layer 325. The dopant concentration in the buried doped layer 330 is typically in the range of approximately $10^{18-20}$ atoms/$cm^{-3}$ and the dopant concentration in the N-epi region 325 is typically in the range of approximately $10^{14-16}$ atoms/$cm^{-3}$.

The illustrated embodiment of the capacitor 300 includes sinkers 335 that form a portion of the "plates" of the capacitor 300. The sinkers 335 shown in FIG. 3 are formed by implanting an N-type dopant material and then applying heat to cause the dopant material to diffuse outwards and downwards so that the sinkers 335 overlap with the buried layer 330. The region in which the sinkers 335 overlap (or crossover) with the buried layer 330 is typically referred to as the crossover region 337. The dopant concentration in the crossover region 337 is approximately in the range from $2 \times 10^{15}$ to $5 \times 10^{17}$ ions/cm$^3$. The dopant concentration in other portions of the buried layer 330 and/or the sinkers 335 is typically higher than the dopant concentration in the crossover region.

A trench 340 may be formed between the sinkers 335. The trench 340 is filled with a dielectric portion 345 and a conductive fill 350 such as polysilicon. In one embodiment, the active layer 320, the buried layer 330, and the N-epi region 325 may be etched to form the trench 340 and then a dielectric layer 345 (or stack of dielectric layers) can be deposited on the walls of the trench 340. For example, an oxide layer and/or a nitride layer can be deposited on the walls of the trench 340 to form the dielectric layer 345. The conductive fill 350, which may be doped or undoped, is used to fill the remaining opening in the trench 340 after the dielectric layer 345 has been formed. The conductive fill 350 forms one of the "plates" of the capacitor. The dielectric portion 345 forms the "dielectric" of the capacitor. However, as discussed herein, conventional capacitors that are formed using only the polysilicon fill 350 as one "plate" of the capacitor, the dielectric portion 345 as the "dielectric" of the capacitor, and the doped layers 330, 335 as the other "plate" of the capacitor suffer from deep depletion effects, e.g., when the voltage applied to the capacitor varies.

The capacitor 300 differs from the conventional semiconductor trench capacitor by including one or more additional doped regions 355 (indicated by the bold lines) in the "plate" of the capacitor 300 formed by the doped layers 330, 335. The doped region 355 is doped using a dopant species that has the opposite type to the dopant species used to form the doped layer 330, 335. For example, if the doped layers 330, 335 are doped with an N-type dopant as in the illustrated embodiment, then the doped region 355 is doped using a P-type dopant. For another example, if the doped layers 330, 335 are doped with a P-type dopant, then the doped region 355 is doped using an N-type dopant. In various alternative embodiments, the doped region 355 can be formed using well-known implantation and/or diffusion techniques and in the interest of clarity these techniques will not be discussed further herein. Voltages may then be applied to the capacitor 300 using the contacts (C+, C−).

A supply of minority carriers may be generated by the p-n junction (or the n-p junction in alternative embodiments) between the doped region 355 and the doped regions 330, 335 when a voltage is applied to the capacitor. The supply of minority carriers may allow the capacitor 300 to follow the varying signal/voltage and reduce deep depletion effects in the capacitor 300. In one embodiment, the dopant concentration in the doped region 355 is larger than the dopant concentration in the doped layers 330, 335. For example, the characteristic dopant concentration in the doped region 355 may be approximately within the range $10^{18-19}$ atoms/cm$^{-3}$ and the characteristic dopant concentration in the crossover region between the overlapping doped layers 330, 335 may be approximately within the range $10^{16-17}$ atoms/cm$^{-3}$. However, in some embodiments the characteristic dopant concentration in the doped region 355 may be lower than $10^{18}$ atoms/cm$^{-3}$.

Figure 4:
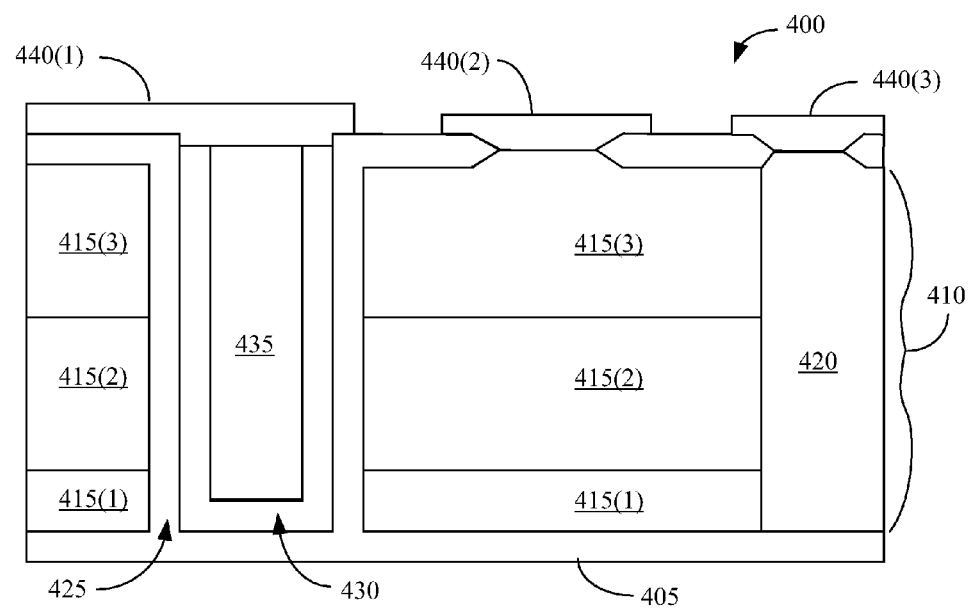
FIG. 4 conceptually illustrates a second exemplary embodiment of a capacitor formed using bipolar technology.

FIG. 4 conceptually illustrates a second exemplary embodiment of a capacitor 400 formed using bipolar technology. In the second exemplary embodiment, the capacitor 400 is formed over a substrate 405. The capacitor 400 includes a doped silicon tub 410 that includes doped layers 415(1-3) that are doped with varying concentrations of one type of dopant, which may be either an N-type dopant or a P-type dopant. In one embodiment, the doped layers 415(1-3) include a portion of an active layer 415(1), a buried doped layer 415(2), and a doped sinker 415(3). However, persons of ordinary skill in the art having benefit of the present disclosure should appreciate that the doped silicon tub 410 may include more or fewer layers. The layers 415 in the doped silicon tub 410 may also represent a relatively continuous variation in the dopant concentration rather than the strictly defined and bounded layers 415 depicted in FIG. 4. Techniques for forming the doped silicon tub 410 are known in the art and in the interest of clarity will not be discussed further herein.

Another doped region 420 may be formed within the silicon tub 410. The doped region 420 is doped with a dopant species having a dopant type that is opposite to the dopant type used for the doped silicon tub 410. For example, if the doped silicon tub 410 is doped with an N-type material, then the doped region 420 may be doped with a P-type material, and vice versa. In the illustrated embodiment, the layers 415 and the doped region 420 form one "plate" of the capacitor 400. The junction between the layers 415 and the oppositely doped region 420 can supply minority carriers that may reduce deep depletion effects in the capacitor 400. In one embodiment, the oppositely doped region 420 is formed from a sinker (not shown) and a portion of a buried layer (not shown). Alternatively, the oppositely doped region 420 can be made of a sinker alone, although using only a sinker may reduce the depth of the oppositely doped region 420.

A trench may be etched into the silicon tub 410 and then filled with a dielectric material and a conductive material such as polysilicon. In the illustrated embodiment, a trench liner oxide 425 is deposited on the walls of the trench and then a trench liner nitride 430 is deposited on the trench liner oxide 425. For example, a trench liner oxide 425 having a thickness approximately in the range from 1000 to 10000 Å and a trench liner nitride 430 having a thickness in the range from approximately 200 to 5000 Å may be deposited within the trench. Alternatively, additional dielectric material may be deposited within the trench or only a trench liner oxide 425 or a trench liner nitride 430 may be deposited within the trench. In the illustrated embodiment, the oxide material used to form the trench liner oxide 425 may also be deposited over portions of the doped silicon tub 410, as shown in FIG. 4. In the illustrated embodiment, the trench liner oxide 425 and the trench liner nitride 430 form the "dielectric" of the capacitor 400. A polysilicon fill 435 is then deposited within the trench liner nitride 430. The polysilicon fill 435 forms another "plate" of the capacitor 400.

Contacts 440(1-3) can be formed to provide electrical contacts to the "plates" of the capacitor 400. In the illustrated embodiment, the contacts 440 are formed by opening portions of the oxide 425 formed over the silicon tub 410 and then depositing conductive material so that the conductive material contacts the layers 415, the doped region 420, and the polysilicon fill 435. The conductive material may then be patterned to form the contacts 440. Techniques for opening portions of oxide layers, depositing conductive material and patterning the conductive material to form contacts 440 are well known and in the interest of clarity will not be discussed further herein.

Figure 2:
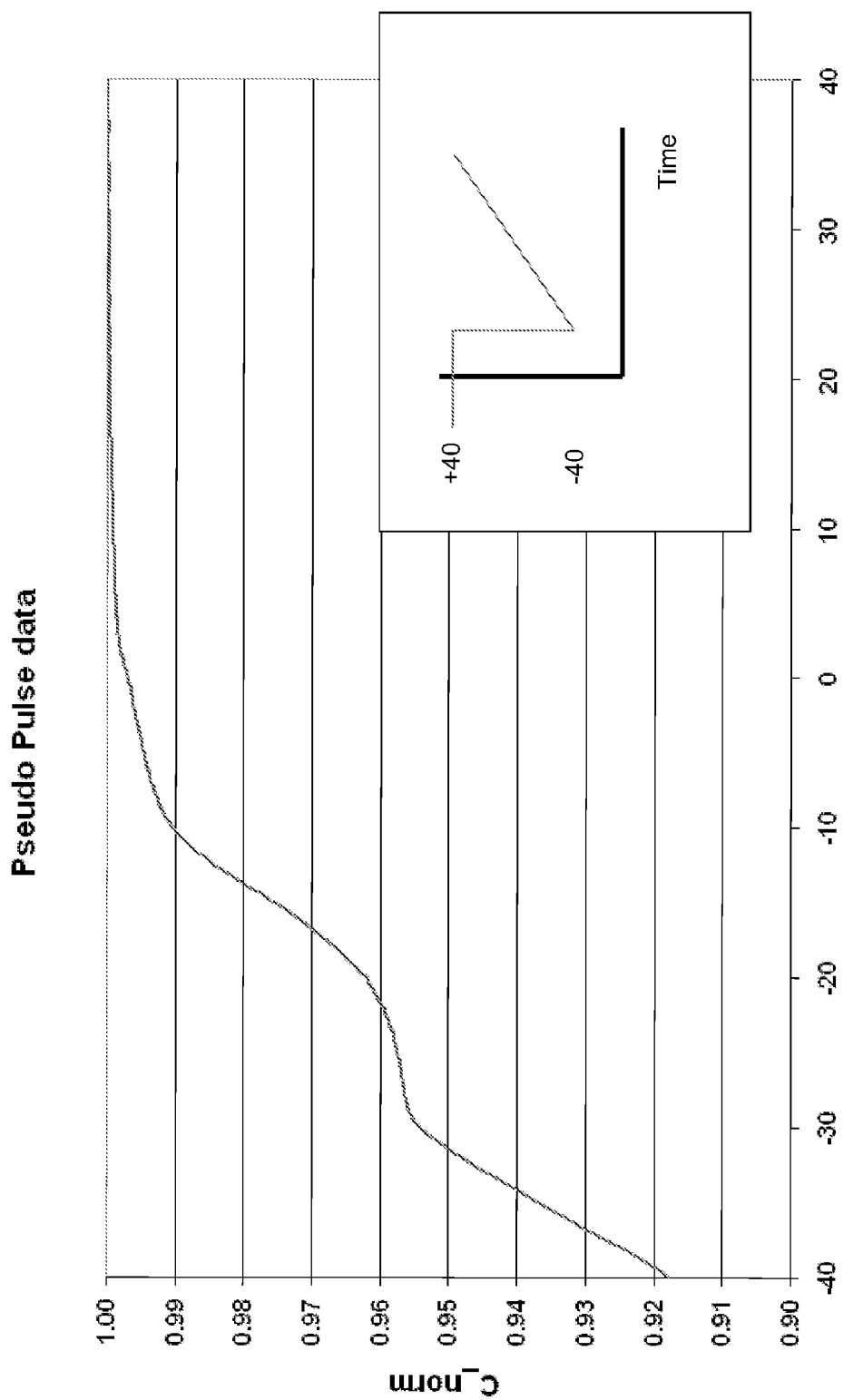
FIG. 2 shows the variation in capacitance of the capacitor depicted in FIG. 1C as a function of the applied voltage.
Figure 5:
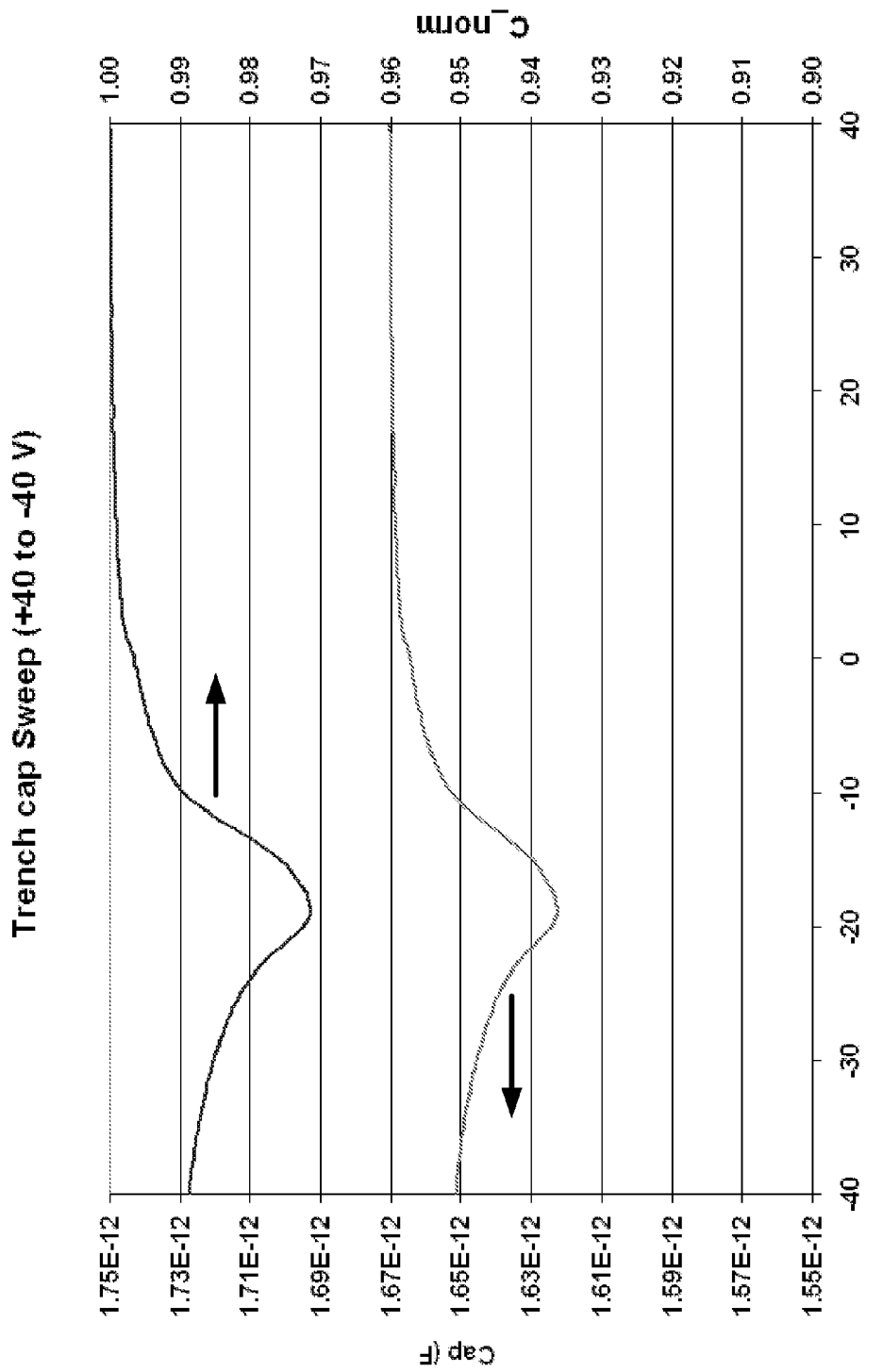
FIG. 5 shows the variation in capacitance of a capacitor as a function of the applied voltage.

FIG. 5 shows the variation in capacitance of a capacitor as a function of the applied voltage. The bias voltage applied to the capacitor is indicated along the horizontal axis and the normalized capacitance is indicated along the right-hand vertical axis. The actual capacitance (in farads) is indicated along the left-hand vertical axis. The capacitance of the trench capacitor is measured as a function of the bias voltage as the bias voltage sweeps between −40 V and +40 V. The upper curve shown in FIG. 5 indicates the normalized capacitance measured on the right-hand vertical axis, as indicated by the arrow pointing to the right. The lower curve shown in FIG. 5 indicates the actual capacitance measured on the left-hand vertical axis, as indicated by the arrow pointing to the left. As shown in FIG. 5, the normalized capacitance of the trench capacitor remains within the range 0.97-1.0 as the bias voltage sweeps from −40 V to +40 V. Comparison of the measured capacitances in FIG. 5 and the measured capacitances in FIG. 2 demonstrate that including the additional oppositely doped region significantly reduces the depletion effects.

Figure 6:
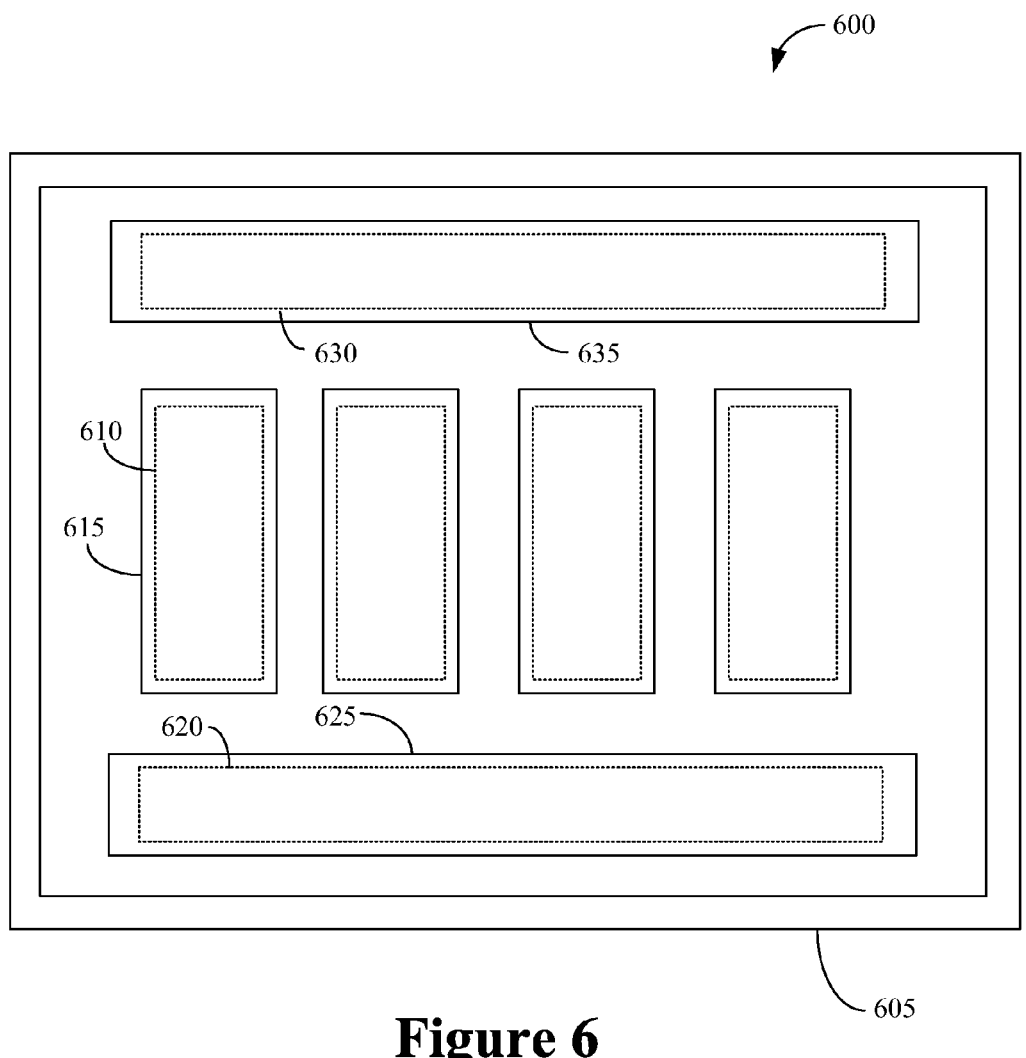
FIG. 6 conceptually illustrates a third exemplary embodiment of a capacitor formed using bipolar technology.

FIG. 6 conceptually illustrates a third exemplary embodiment of a capacitor 600 formed using bipolar technology. In the illustrated embodiment, the capacitor 600 is shown in a top-down view and is formed in a region that is bounded by an isolation trench 605. The capacitor 600 includes a plurality of trenches including polysilicon fill 610 that functions as one of the "plates" of the capacitor 600. The polysilicon fill regions 610 are contacted by contacts 615. The dashed lines indicate that the filled trenches 610 are located beneath the contacts 615. The contacts 615 to the filled trenches 610 may be coupled together using additional conductive lines and/or vias (not shown) so that the capacitance of the capacitor 600 is determined by the properties of all of the filled trenches 610. Although four trenches 610 are depicted in FIG. 6, persons of ordinary skill in the art having benefit of the present disclosure should appreciate that any number of trenches 610 may be included in the capacitor 600.

The capacitor 600 also includes a first doped region 620 and a second doped region 630. In the illustrated embodiment, the first and second doped regions 620, 630 are doped with dopants of opposite types so that the junction between the first and second doped regions 620, 630 can supply carriers to reduce or mitigate the effects of the deep depletion in the capacitor 600. The first and second doped regions 620, 630 are contacted using conductive contacts 625, 635, respectively. Persons of ordinary skill in the art having benefit of the present disclosure should appreciate that the particular arrangement of the first and second doped regions 620, 630, as well as the contacts 625, 635, shown in FIG. 6 is intended to be illustrative and is not intended to be limiting. To the contrary, persons of ordinary skill in the art having benefit of the present disclosure should appreciate that numerous alternative arrangements of the first and second doped regions 620, 630 and the contacts 625, 635 may be used in alternative embodiments of the capacitor 600.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A capacitor, comprising:
   a buried doped layer doped with a first type of dopant;
   at least one trench defined in a semiconductor layer above the buried doped layer and extending at least partially into said buried doped layer, wherein said at least one trench comprises dielectric material deposited on the trench walls and a conductive fill material disposed within the trench and above the dielectric material
   at least one first doped region defined in the semiconductor layer and extending into said buried doped layer, said at least one first doped region being disposed adjacent said at least one trench in the semiconductor layer and doped with said first type of dopant;
   at least one second doped region disposed adjacent said at least one first doped region in the semiconductor layer and extending into said buried doped layer, said at least one second doped region being doped with a second type of dopant that is opposite to the first type of dopant;
   at least one first contact region contacting the conductive fill to define a first plate of the capacitor; and
   at least one second contact region contacting the first and second doped regions to define a second plate of the capacitor, the dielectric material defining a capacitor dielectric of the capacitor.

2. The capacitor of claim 1, wherein the dielectric material comprises at least one of a trench liner oxide and a trench liner nitride, and wherein the conductive fill material is polysilicon.

3. The capacitor of claim 1, wherein said at least one second doped region partially overlaps said at least one first doped region.

4. The capacitor of claim 1, wherein said at least one second doped region provides a supply of minority carriers when a voltage is applied to the capacitor.

5. The capacitor of claim 4, wherein said at least one second doped region provides the supply of minority carriers when the voltage applied to the capacitor varies, the supply of minority carriers reducing depletion in said at least one first doped region.

6. The capacitor of claim 1, wherein a first dopant concentration in said at least one first doped region is lower than a second dopant concentration in said at least one second doped region.

7. The capacitor of claim 6, wherein the first dopant concentration is within the range $10^{18-19}$ atoms/cm$^{-3}$ and the second dopant concentration is within the range $10^{16-17}$ atoms/cm$^{-3}$.

8. The capacitor of claim 1, wherein said at least one trench comprises a plurality of trenches defined within a portion of the semiconductor layer that is bounded by an isolation trench.

9. The capacitor of claim 1, wherein the substrate comprises a buried insulating layer disposed below said buried doped layer, and the trench extends to the buried insulating layer.

10. A method of forming a capacitor, comprising:
    forming a buried doped layer doped with a first type of dopant in a substrate;
    forming at least one trench in a semiconductor layer above the buried doped layer and extending at least partially into said buried doped layer, wherein said at least one trench comprises dielectric material deposited on the trench walls and a conductive fill material formed within the trench and above the dielectric material;
    forming at least one first doped region in the semiconductor layer and extending into said buried doped layer, said at least one first doped region being adjacent said at least one trench in the semiconductor layer and being doped with said first type of dopant;
    forming at least one second doped region adjacent said at least one first doped region in the semiconductor layer and extending into said buried doped layer, said at least one second doped region being doped with a second type of dopant that is opposite to the first type of dopant;

forming at least one first contact region to contact the polysilicon fill and define a first plate of the capacitor; and forming at least one second contact region to contact the first and second doped regions and define a second plate of the capacitor, the dielectric material defining a capacitor dielectric of the capacitor.

11. The method of claim 10, wherein forming said at least one trench comprises:

etching said at least one trench in the semiconductor layer;

depositing at least one of a trench liner oxide or a trench liner nitride on walls of said at least one trench; and depositing the conductive fill material within said at least one trench above said at least one trench liner oxide or trench liner nitride, wherein the conductive fill material comprises polysilicon.

12. The method of claim 10, wherein forming said at least one first doped region comprises:

growing an epitaxial region over the substrate, the epitaxial region including a buried doped layer;

implanting the first type of dopant into a portion of the epitaxial region above the buried doped layer; and applying heat to cause the first type of dopant to diffuse.

13. The method of claim 10, wherein forming said at least one second doped region comprises forming said at least one second doped region so that said at least one second doped region partially overlaps said at least one first doped region.

14. The method of claim 10, wherein forming said at least one second doped region comprises forming said at least one second doped region to provide a supply of minority carriers when a voltage is applied to the capacitor.

15. The method of claim 14, wherein forming said at least one second doped region to provide the supply of minority carriers comprises forming said at least one second doped region to provide the supply of minority carriers when the voltage applied to the capacitor varies, the supply of minority carriers reducing depletion in said at least one first doped region.

16. The method of claim 10, wherein forming the first and second doped regions comprises forming the first and second doped regions such that a first dopant concentration in said at least one first doped region is lower than a second dopant concentration in said at least one second doped region.

17. The capacitor of claim 16, wherein forming the first and second doped regions comprises forming the first and second doped regions such that the first dopant concentration is within the range $10^{18-19}$ atoms/cm$^{-3}$ and the second dopant concentration is within the range $10^{16-17}$ atoms/cm$^{-3}$.

18. The capacitor of claim 10, wherein forming said at least one trench comprises forming a plurality of trenches within a portion of the semiconductor layer that is bounded by an isolation trench.

19. The method of claim 10, wherein the substrate comprises a buried insulating layer disposed below said buried doped layer, and forming the at least one trench comprises forming the trench to extend to the buried insulating layer.

* * * * *